US006851831B2

United States Patent
Karlicek, Jr.

(10) Patent No.: US 6,851,831 B2
(45) Date of Patent: Feb. 8, 2005

(54) CLOSE PACKING LED ASSEMBLY WITH VERSATILE INTERCONNECT ARCHITECTURE

(75) Inventor: Robert F. Karlicek, Jr., Santa Maria, CA (US)

(73) Assignee: GELcore LLC, Valley View, OH (US)

(*) Notice: Subject to any disclaimer, the term of this patent is extended or adjusted under 35 U.S.C. 154(b) by 141 days.

(21) Appl. No.: 10/063,364

(22) Filed: Apr. 16, 2002

(65) Prior Publication Data

US 2003/0193789 A1 Oct. 16, 2003

(51) Int. Cl.[7] .............................................. F21V 21/005
(52) U.S. Cl. ...................... 362/249; 362/227; 362/800
(58) Field of Search ................................ 362/249, 252, 362/104, 125, 211, 213, 227, 800, 250, 238, 240, 555; 439/445–447; 313/500, 510, 495; 40/450, 451, 594; 345/33, 34, 36, 39, 40; 359/152; 372/109, 36; 385/14

(56) References Cited

U.S. PATENT DOCUMENTS

| | | | | |
|---|---|---|---|---|
| 4,173,035 A | * | 10/1979 | Hoyt ............................ | 362/249 |
| 4,369,435 A | * | 1/1983 | Adachi et al. ............... | 340/506 |
| 4,393,677 A | * | 7/1983 | Tamura et al. ................ | 72/97 |
| 5,539,767 A | * | 7/1996 | Nakanishi et al. ........... | 372/109 |
| 6,361,357 B1 | * | 3/2002 | Stillwell et al. ............. | 439/490 |
| 6,411,522 B1 | * | 6/2002 | Frank et al. ................. | 361/800 |
| 6,443,597 B1 | * | 9/2002 | Natori ........................ | 362/304 |
| 2002/0033979 A1 | * | 3/2002 | Dair et al. ................... | 359/152 |
| 2002/0149312 A1 | * | 10/2002 | Roberts et al. ............. | 313/495 |
| 2003/0185020 A1 | * | 10/2003 | Stekelenburg .............. | 362/555 |

FOREIGN PATENT DOCUMENTS

JP     2002-144975     * 12/2001

* cited by examiner

*Primary Examiner*—Alan Cariaso
*Assistant Examiner*—Mark Tsidulko
(74) *Attorney, Agent, or Firm*—Fay, Sharpe, Fagan, Minnich & McKee, LLP

(57) ABSTRACT

A modular mounting assembly (10) for connecting a plurality of LEDs in a selectable electrical and spatial arrangement includes a plurality of substrates (12) each having at least one LED (14a, 14b) fixedly arranged thereon, and a plurality of connectors (16) arranged thereon that are in operative communication with the at least one LED (14a, 14b) fixedly arranged thereon. The plurality of substrates (12) are arranged in a selected spatial arrangement having selected pairs of connectors (16) in operative communication with each other to effectuate electrical connection therebetween, whereby an electrical arrangement of the plurality of LEDs is effectuated. A plurality of interconnecting elements (50A, 50D, 50S, 50P) electrically and structurally interconnect selected spatially adjacent substrates (12) in cooperation with the selected pairs of connectors. A connector (16) has a plurality of electrical conductor members (1, 2, 3, 4, 5), and an interconnecting element (50) has a selected electrical configuration that effectuates a selected interconnection of conductor members (1, 2, 3, 4, 5).

18 Claims, 20 Drawing Sheets

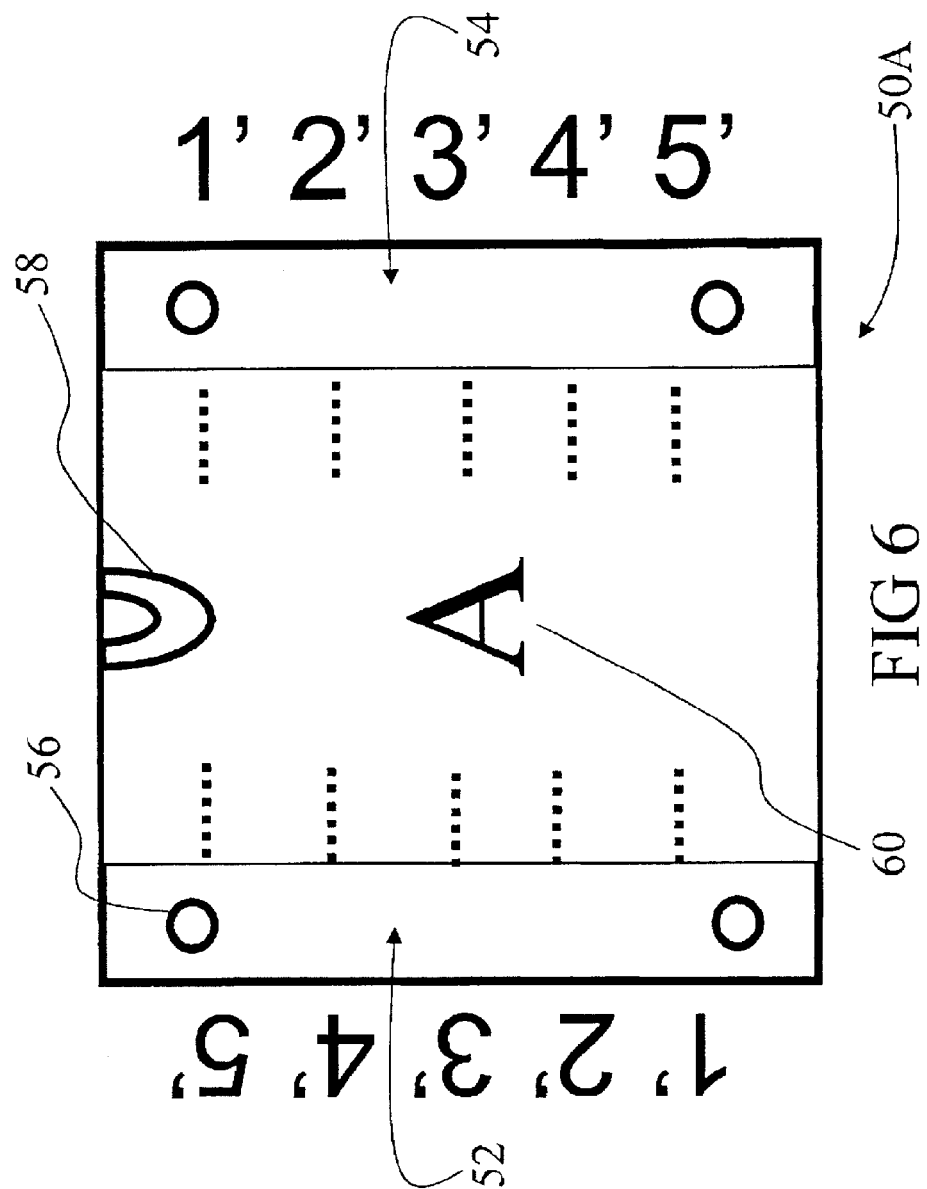

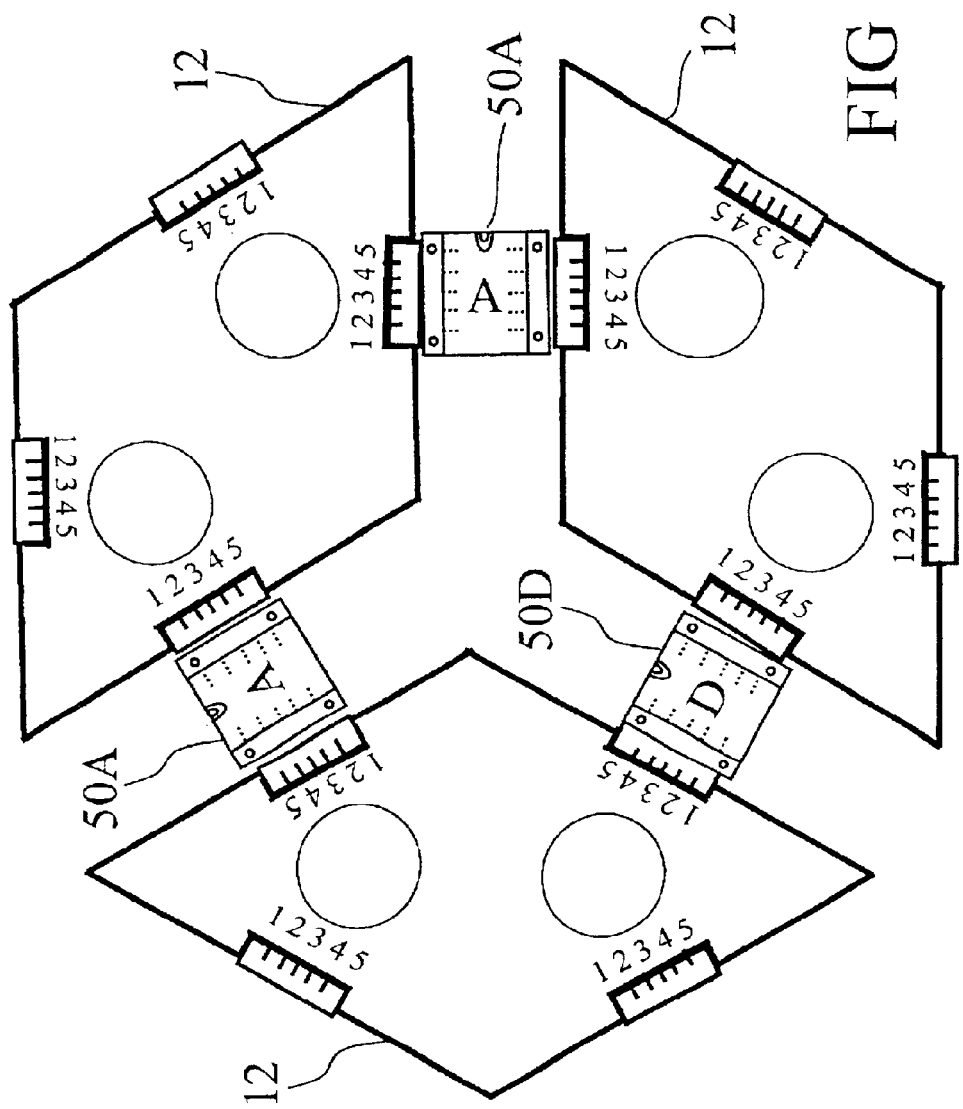

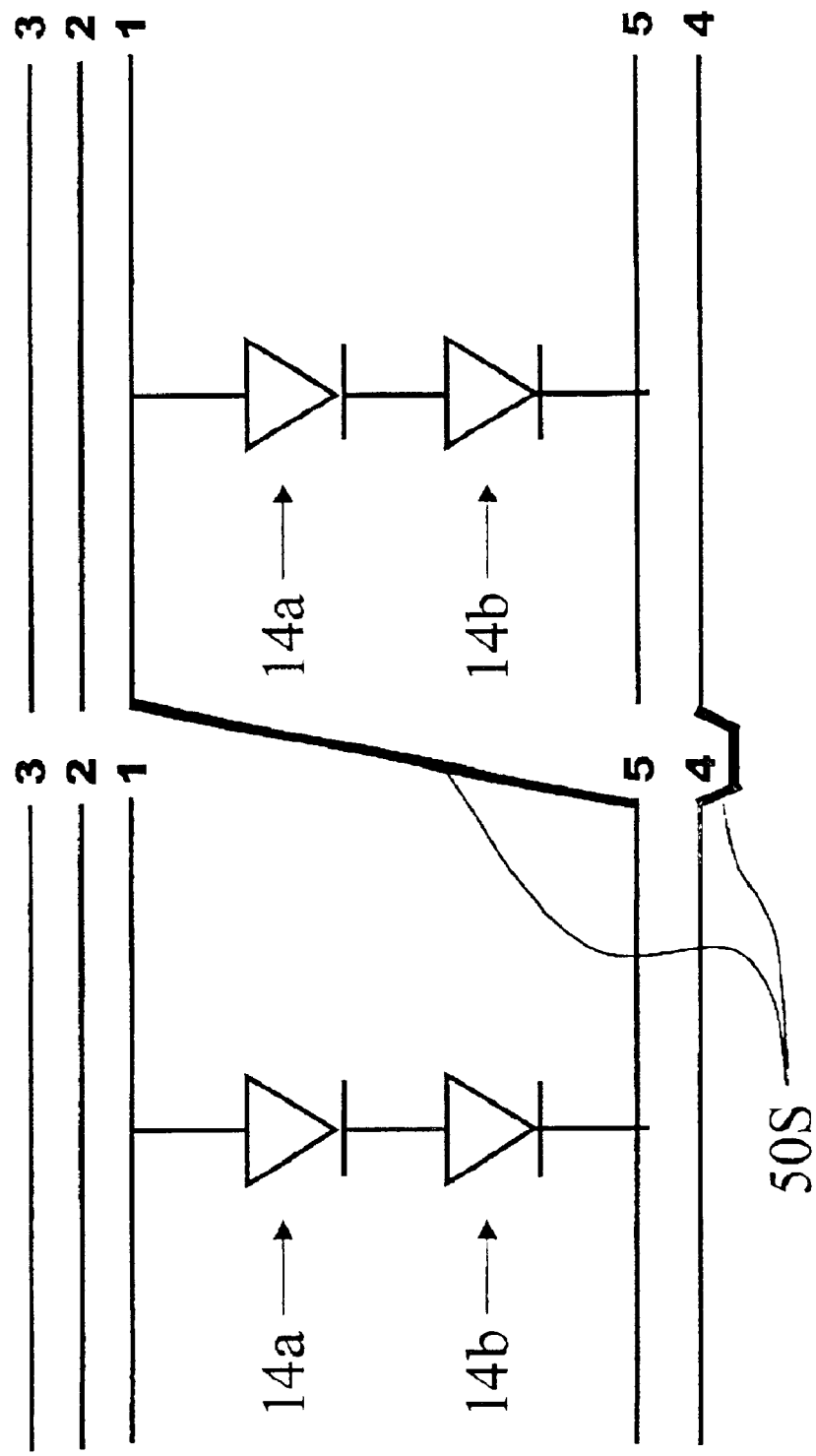

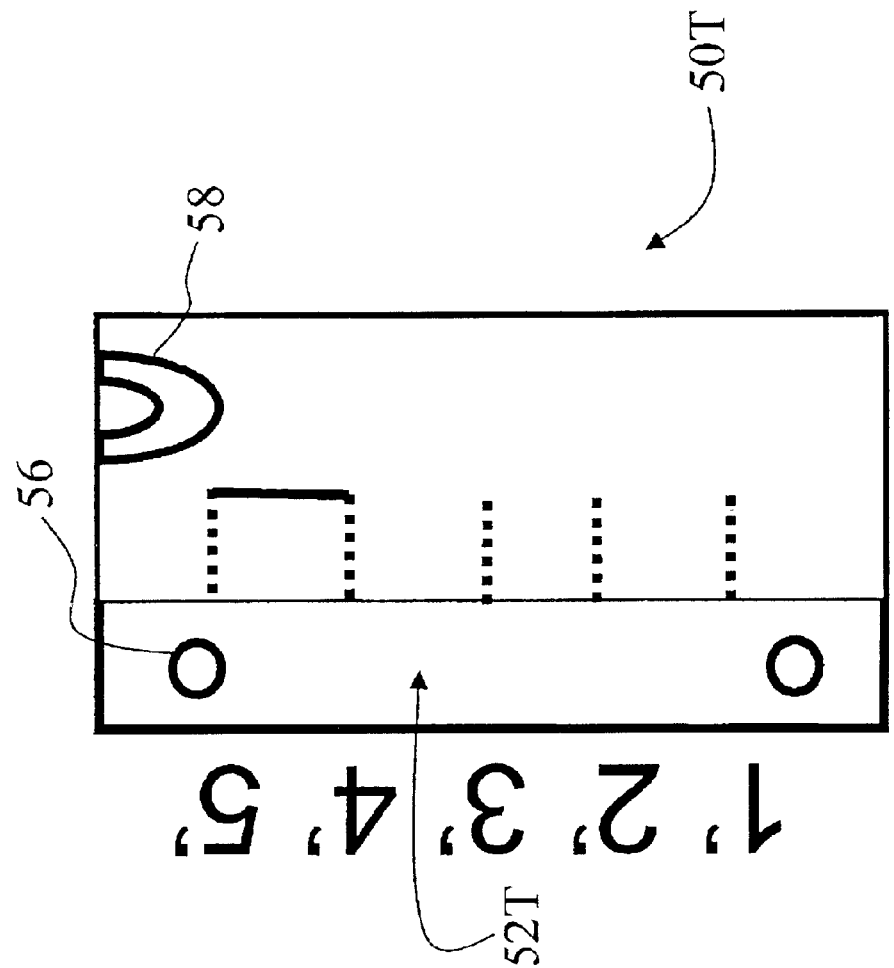

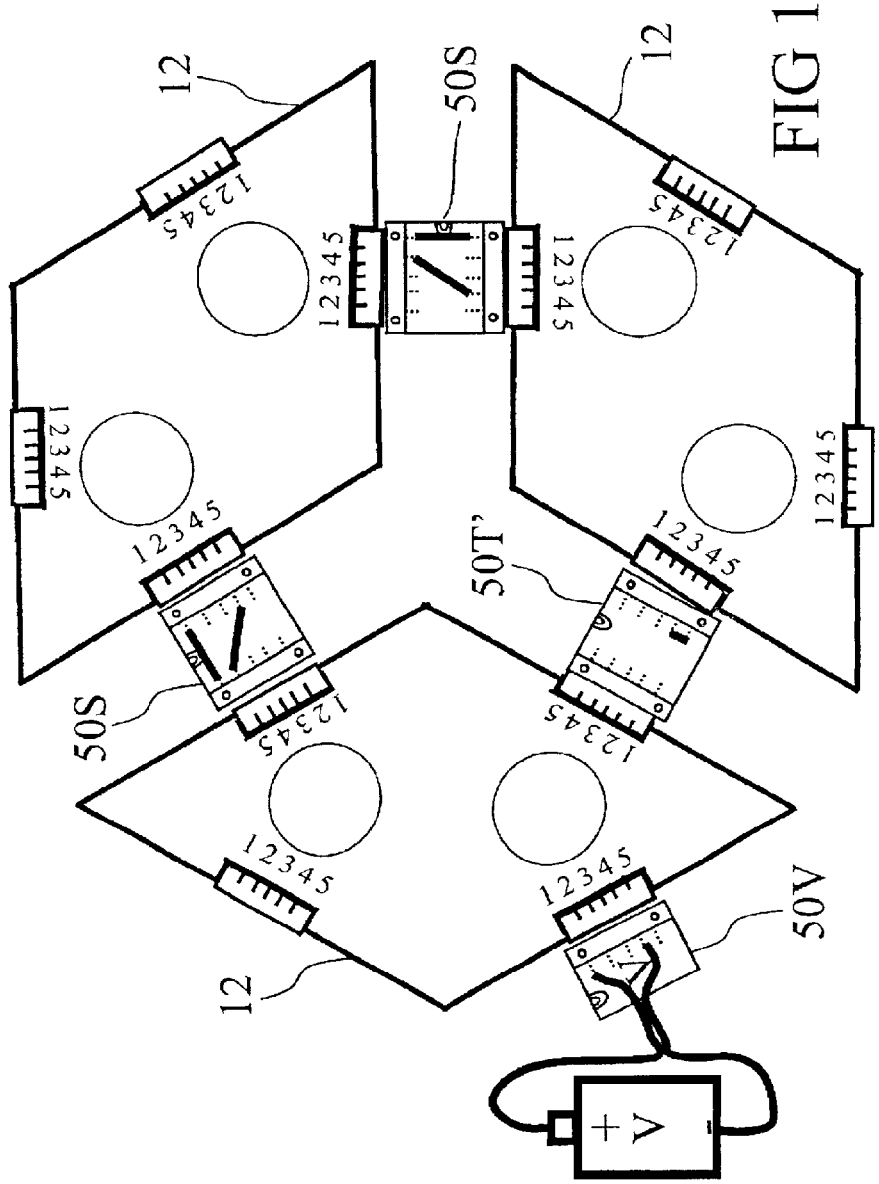

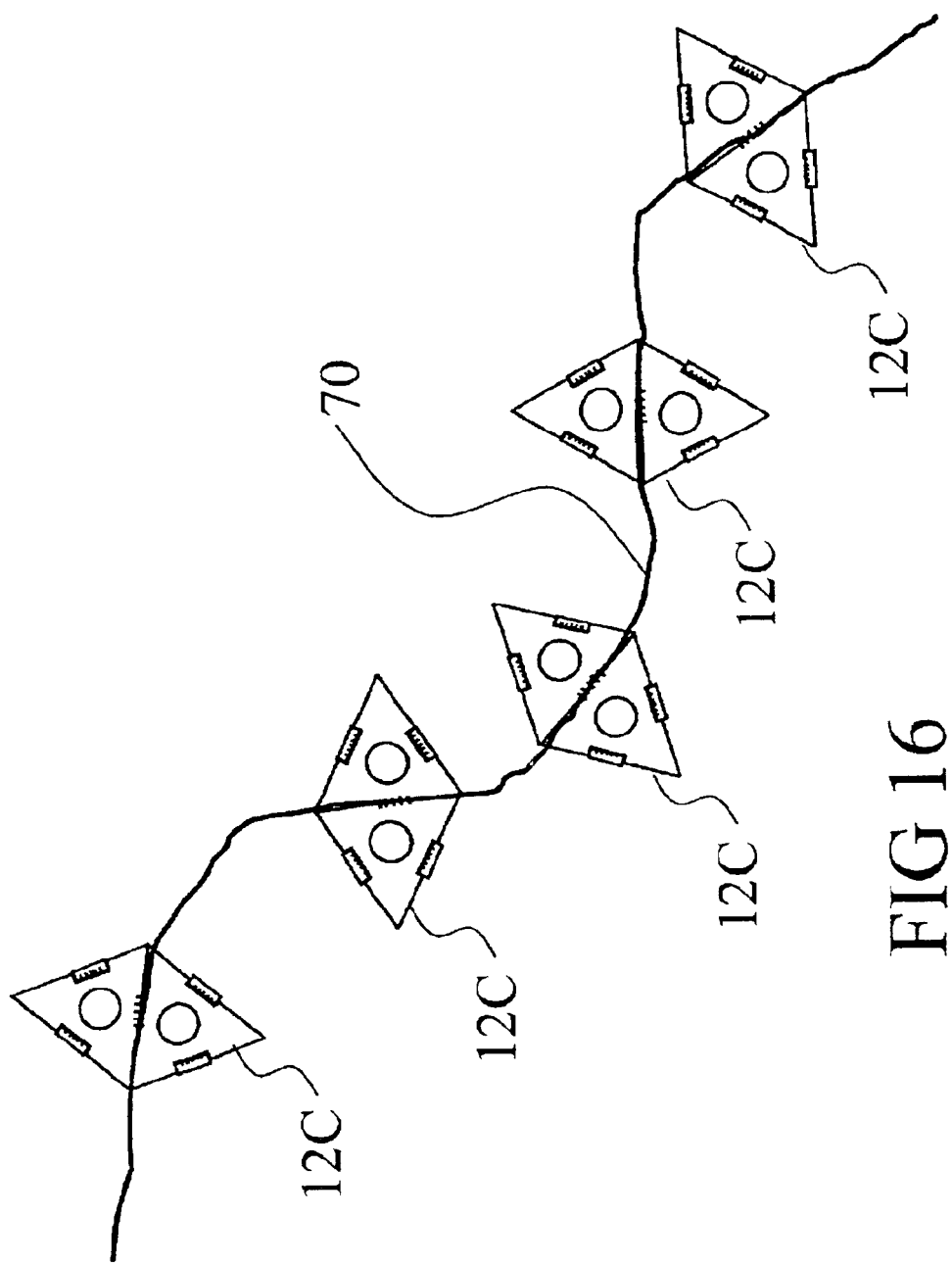

CLOSE PACKING LED ASSEMBLY WITH VERSATILE INTERCONNECT ARCHITECTURE

BACKGROUND OF INVENTION

The invention relates to the electronic and optoelectronic arts. It is especially applicable to the packaging of light emitting diodes (LEDs) and will be described with particular reference thereto. However, the invention will also find application in the packaging other electronic and optoelectronic devices, such as photodetectors, signal receivers, vertical cavity surface emitting lasers (VCSELs), photovoltaic devices, and the like.

Light emitting diodes find application in fiber optical communications, lighting applications, display applications, and other applications where a compact, low voltage, rugged, and high efficiency light source is advantageous. In many LED applications, a plurality of LEDs are advantageously arranged into an array or other pre-determined arrangement comprising similar or dissimilar LED types. In lighting or display applications, LEDs emitting in the red, green, and blue regions are preferably closely packed to form a color "pixel" that blends the three colors. In this manner white light can be generated. Alternatively, by selectively varying the optical output intensity of the three colored LEDs, a selected color can be generated. An array of such "pixels" can form a color display or an illuminating surface emitting white light, among other applications.

The prior art includes fabrication of LED arrays on-chip. In this approach, semiconductor layers comprising the LEDs are generated on a substrate, usually a semiconductor substrate, and individual LEDs of the array are isolated by etching mesas in the LED layers. This approach is limited in application. The LEDs are typically required to be all of one type. The choice of substrate is limited to those compatible with the semiconductor layer generation method. Many commercial LEDs are formed from III–V compound semiconductor layers, and the substrates which are used for the growth of such layers, typically including GaAs and InP wafers, sapphire substrates, and the like, are often expensive, fragile, and of limited lateral area.

A much more flexible approach is to fabricate discrete LEDs using any convenient method, and then to bond the discrete LEDs to a host substrate to form the LED arrangement thereon. In this manner dissimilar LEDs, such as red, green, and blue LEDs comprised of different material layers, can be advantageously combined. The choice of substrate is greatly expanded. However, the individual LEDs are electrically isolated, so that intricate wire bonding or other electrical interconnecting methods are typically applied to complete the array. Additionally, a different host substrate shape and electrical interconnect pattern is needed for each distinct LED arrangement, which limits the standardization of parts and complicates array manufacturing.

The present invention contemplates an improved modular mounting assembly for forming arrays of LEDs and other components.

SUMMARY OF INVENTION

In accordance with one embodiment of the present invention, a mounting structure for assembling a plurality of optoelectronic components is disclosed. A first substrate has at least one first optoelectronic component arranged thereon. The first substrate is in the shape of a rhombus and has an edge connector disposed on an edge thereof. A second substrate has at least one second optoelectronic component arranged thereon. The second substrate is in the shape of a rhombus and has an edge connector disposed on an edge thereof which operatively connects with the edge connector of the first substrate to form an arrangement of the at least one first optoelectronic component and the at least one second optoelectronic component.

In accordance with another aspect of the present invention, at least one of the first substrate and the second substrate has a rhombus shape that corresponds to a primitive unit cell of a hexagon.

In accordance with another aspect of the present invention, an interconnecting element connects with the edge connector of the first substrate and with the edge connector of the second substrate to connect the edge connector of the first substrate with the edge connector of the second element.

In accordance with another aspect of the present invention, the first substrate includes an electrical connection between the at least one first component and the edge connector of the first substrate. The second substrate includes an electrical connection between the at least one second component and the edge connector of the second substrate. The interconnecting element electrically connects the edge connector of the first substrate with the edge connector of the second substrate to form an electrical arrangement of the at least one first component and the at least one second component.

In accordance with another aspect of the present invention, the first substrate includes a thermally conductive layer, and a printed circuit board into which the edge connector is formed. The printed circuit board includes an electrical path connecting the at least one first optoelectronic component with the edge connector.

In accordance with another aspect of the present invention, the at least one first optoelectronic component includes at least one light emitting diode (LED). The first substrate includes a lens in operative communication with the at least one LED.

In accordance with another aspect of the present invention, the at least one first optoelectronic component includes a plurality of light emitting diodes (LEDs) disposed on the substrate. The printed circuit board includes an electrical path that electrically interconnects the LEDs disposed on the substrate.

In accordance with another aspect of the present invention, the thermally conductive layer has depressions in which the LEDs are arranged, and the printed circuit board has holes arranged to allow the LED light emission to pass through.

In accordance with another aspect of the present invention, a third substrate has at least one third component arranged thereon. The third substrate is in the shape of a rhombus and has a first edge connector disposed on an edge thereof which operatively connects with a second edge connector of the first substrate. The third substrate also has a second edge connector disposed on an edge thereof which operatively connects with a second edge connector of the second substrate. The first, second, and third rhombus-shaped substrates are arranged to form a hexagonally shaped mounting structure.

In accordance with another aspect of the present invention, at least one terminating element completes an electrical circuit.

In accordance with another aspect of the present invention, at least one terminating element supplies electrical power to the mounting structure.

In accordance with another embodiment of the present invention, a modular mounting assembly for connecting a plurality of light emitting diodes (LEDs) in a selectable electrical and spatial arrangement is disclosed. A plurality of substrates are provided. Each substrate has at least one LED fixedly arranged thereon, and a plurality of connectors arranged thereon that are in electrical communication with the at least one LED. The plurality of substrates are arranged in a spatial arrangement having selected pairs of connectors in electrical communication with each other providing an electrical arrangement between the plurality of LEDs.

In accordance with another aspect of the present invention, an interconnecting element electrically and structurally interconnects selected substrates through pairs of connectors. For example, an interconnecting element cooperates with the selected substrates to form one of a series LED electrical interconnection and a parallel LED electrical interconnection.

In accordance with another aspect of the present invention, at least one of the plurality of substrates has a rhombic shape.

In accordance with yet another embodiment of the present invention, an extensible LED structure is disclosed. An LED is supported by a rhomboidal shaped substrate. At least one electrical socket is disposed on the rhomboidal shaped substrate and shaped to receive an electrical plug. The electrical socket provides electrical communication to the LED.

In accordance with another aspect of the present invention, a discrete plug mechanically connects the electrical socket to an electrical socket disposed on a second substrate.

In accordance with another aspect of the present invention, a plug is integral with the substrate. The plug is mechanically connectable to an electrical socket disposed on a second substrate.

In accordance with another aspect of the present invention, the plug comprises electrical paths and when the plug is seated in the socket, the electrical paths place the LED in a predetermined electrical relationship with an LED on the second substrate.

The advantages and benefits of the present invention will become apparent to those of ordinary skill in the art upon reading and understanding the following detailed description.

BRIEF DESCRIPTION OF DRAWINGS

The invention may take form in various components and arrangements of components, and in various steps and arrangements of steps. The drawings are only for purposes of illustrating a preferred embodiment and are not to be construed as limiting the invention.

FIG. 6 shows an exemplary interconnecting element that is compatible with the substrate of FIGS. 3 and 5.

FIG. 7 shows an exploded view of an exemplary interconnection of three rhombic substrates corresponding to the embodiment of FIGS. 3 and 5.

FIG. 8A shows an electrical schematic of a series connection of two substrates corresponding to the substrate embodiment of FIGS. 3 and 5.

FIG. 10B shows an exemplary interconnecting element that implements the circuit termination shown in FIG. 10A.

FIG. 12 shows an exemplary series interconnection of three substrates of the type shown in FIGS. 3 and 5 using appropriate interconnecting and terminating elements.

FIG. 16 shows an exemplary arrangement of several substrates of the type shown in FIG. 15 on an interconnecting cable.

DETAILED DESCRIPTION

Figure 1:
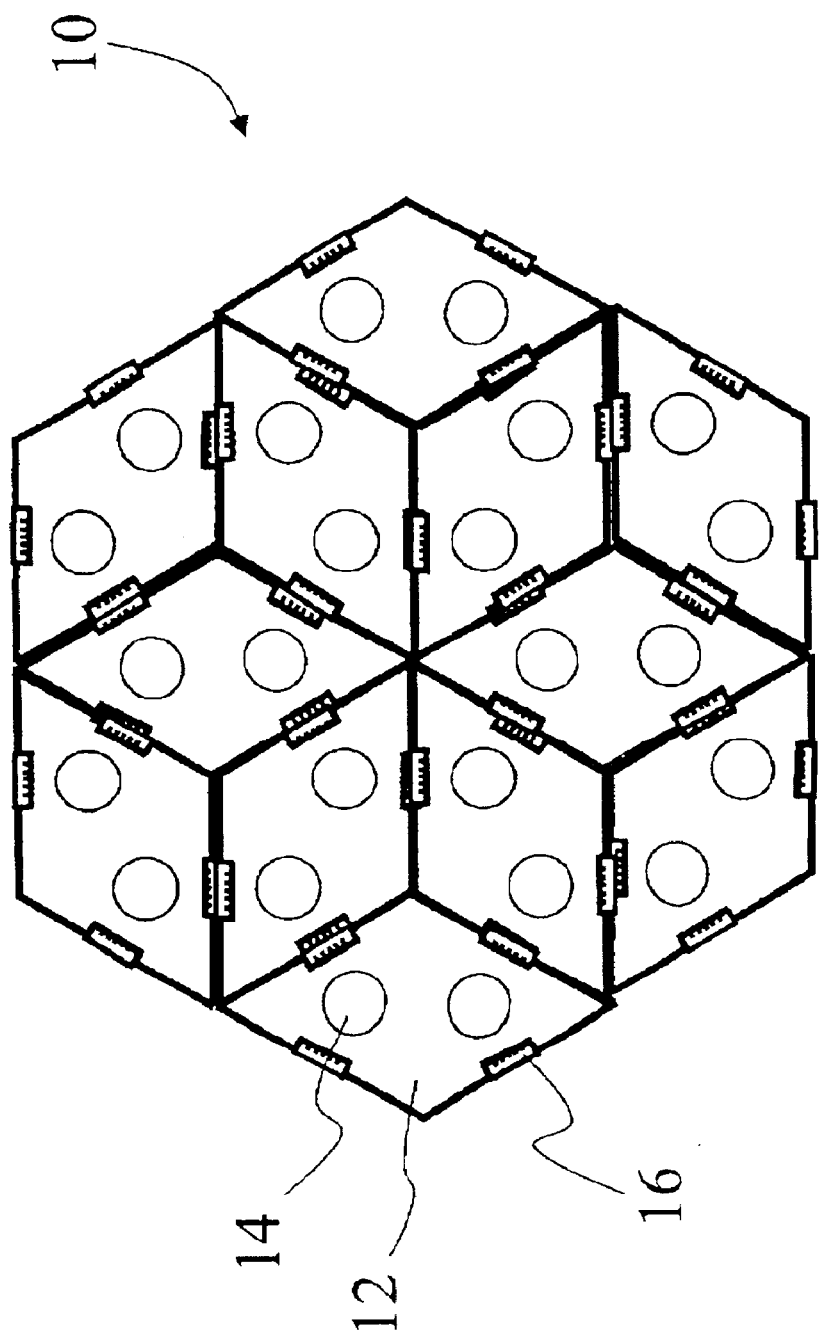
FIG. 1 shows an exemplary array of twelve rhombic substrates forming a hexagonal array of twenty-four components.
Figure 2:
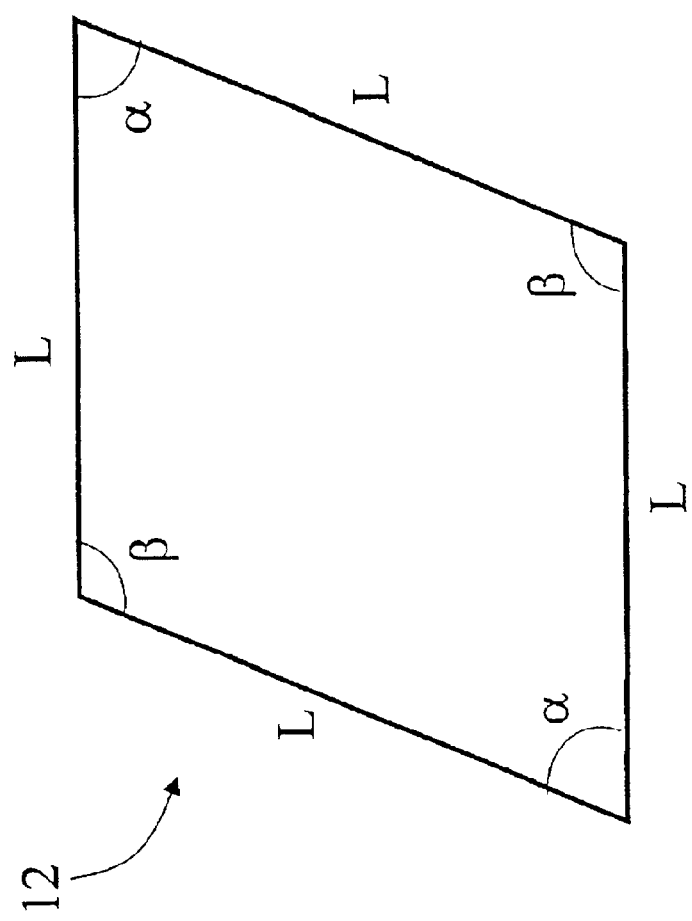
FIG. 2 shows the geometry of an exemplary rhombic substrate.

With reference to FIGS. 1 and 2, a modular mounting assembly 10 is described. A plurality of substrates 12 each have one or more components 14 arranged thereon. In the illustrated embodiment of FIG. 7, each substrate 12 has two LED components 14 arranged thereon. The plurality of substrates 12 are arranged in a selected manner to form the mounting assembly 10 that arranges the components 14 in a selected arrangement, such as the hexagonal arrangement of FIG. 1 comprised of twelve substrates 12 and twenty four LED components 14.

In one embodiment shown in FIGS. 1 and 2, each substrate 12 has the shape of a rhombus, i.e. a parallelogram having four sides of essentially equal length L, with oppositely oriented angles equal. Thus, a rhombus can be specified by two angular parameters $\alpha$ and $\beta$, along with the side length L, as shown in FIG. 2. In the illustrated embodiment of FIG. 1, the angles $\alpha$ and $\beta$ are 60° and 120°, respectively, so that each rhombic substrate 12 corresponds to a primitive unit cell of a hexagon, thus enabling particularly close packing of the components 14 such as in the assembly 10 shown in FIG. 1. Hexagonal symmetry is particularly advantageous because hexagons can be arranged to form densely packed two-dimensional arrays. Hexagonal symmetry also can be used to create three-dimensional structures such as spheres or geodesic-type domes.

In another embodiment (not shown), α=β=90° so that a square unit cell substrate results. It will be appreciated that the rhombic shape provides a high degree of symmetry that enables arrangement of a plurality of rhombic substrates 12 into a wide range of selected spatial arrangements. Of course, other values for the angles α and β can also be used within the geometrical limitation that α+β=180° for the rhombic geometry shown in FIG. 2.

With continuing reference to FIG. 1, each substrate 12 includes one or more connectors 16 that effectuate interconnection of the substrates 12. In one embodiment, the connectors 16 also cooperate to effectuate electrical interconnection of the components 14 across the boundaries of paired substrates 12.

Figure 3:
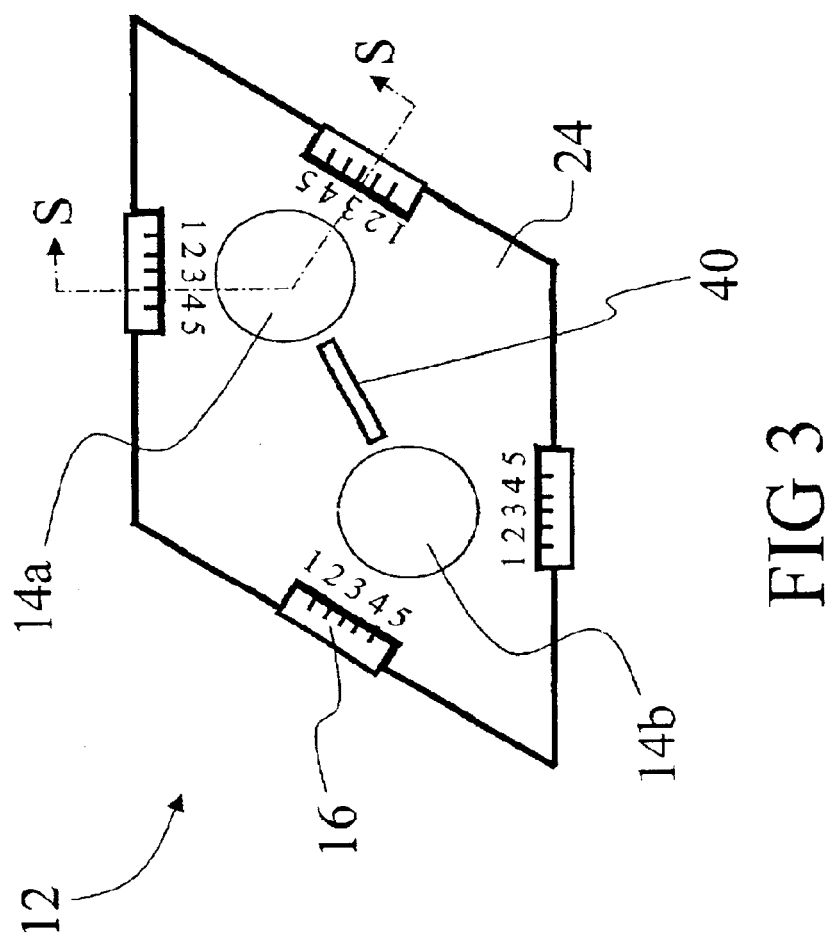
FIG. 3 shows a first embodiment of the invention, having two LED components connected electrically in series on a rhombic substrate.
Figure 4:
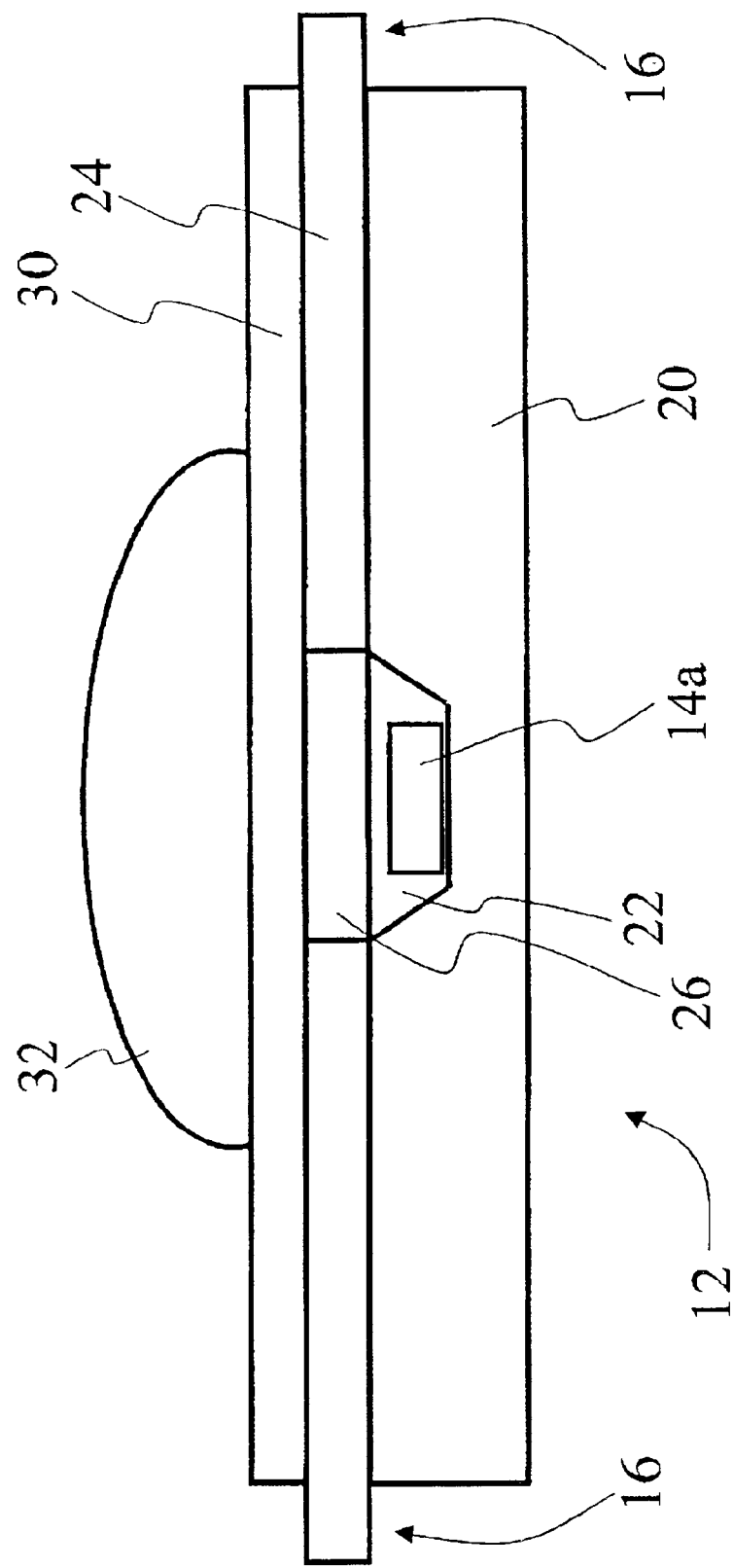
FIG. 4 shows a sectional view of the embodiment of FIG. 3 taken along the Section S—S.

With reference now to FIGS. 3 and 4, the substrate 12 is described. Each substrate 12 has two LED components 14a and 14b arranged thereon. The LEDs 14a, 14b can be similar LEDs, e.g. two similar LED components that both emit white light. Alternatively, the LEDs 14a, 14b can be dissimilar LED components, e.g. LEDs of different colors, different intensities, different angular distributions, etc.

With particular reference now to FIG. 4, which shows a sectional view taken along the Section S—S shown in FIG. 3, the substrate 12 includes a thermally conductive layer 20, such as a copper plate. In an exemplary embodiment a copper plate about 0.3 cm thick is used. Each LED component arranged on the substrate 12, e.g. the exemplary LED 14a is disposed in a receiving depression 22 of the copper plate 20. The receiving depression 22 is a conical well with a flat bottom. The mounting of an LED die therein can employ thermally conductive cement, a resin, an epoxy, or the like, as is well known to those of ordinary skill in the art. The thermally conductive layer 20 provides heat sinking for the LED components 14a, 14b. However, the LED components 14a, 14b are advantageously electrically isolated from the copper plate 20.

An insulating layer such as a printed circuit board (PC board) 24 is affixed to the thermally conductive layer 20. The PC board 24 has one or more openings or holes 26 corresponding to the receiving wells 22 of the copper plate 20, through which the LED light emission passes during LED operation. The substrate 12 optionally includes additional optical components, such as a transparent cover plate 30 and a lens 32 that is in operative communication with the LED 14a.

With continuing reference to FIGS. 3 and 4, the PC board 24 advantageously facilitates electrical connections to the components. A plurality of PC board traces connect the LEDs 14a, 14b to the connectors 16 and optionally also connect the LEDs 14a, 14b to each another. For example, a trace 40 can be used to interconnect the LED's 14a, 14b electrically in series. The electrodes (not shown) of the LED components 14 are connected to the PC board traces 40 using wire bonds or other means (not shown) that are well known to those of ordinary skill in the art. In one embodiment, the connectors 16 are formed into the edges of the PC board 24 so that the traces advantageously directly connect to the electrical conductor members comprising the connectors 16, and the connectors 16 are readily accessible at the edges of the substrate 12. In the illustrated exemplary embodiment of FIG. 3, there are four connectors 16, and each connector has five conductor members 1, 2, 3, 4, and 5.

Figure 5:
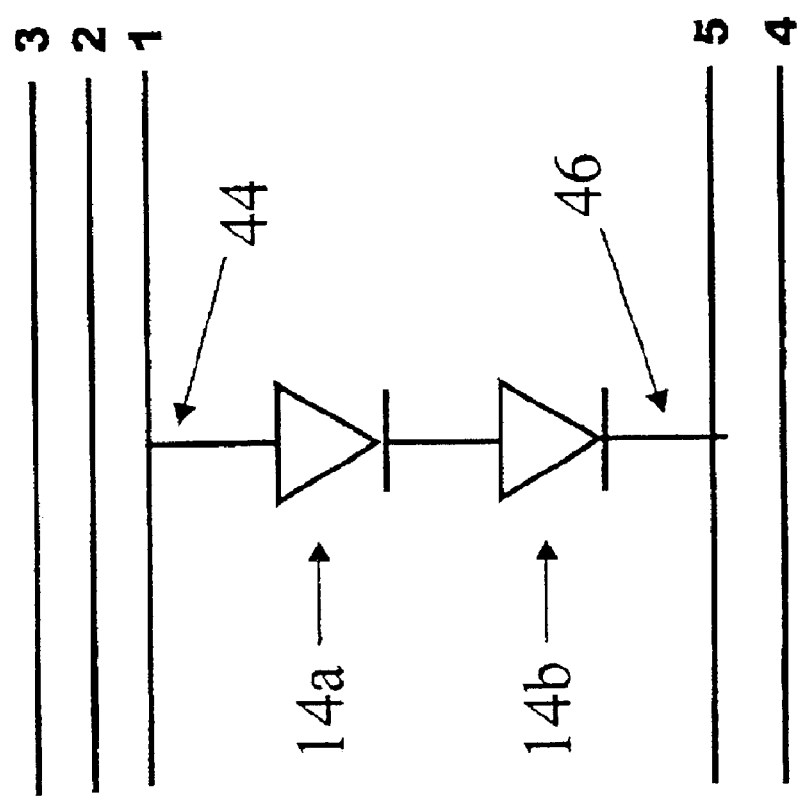
FIG. 5 shows an electrical schematic of the substrate of FIG. 3.

With reference now to FIG. 5, an electrical circuit schematic is shown corresponding to the exemplary substrate 12 of FIGS. 3 and 4. In the illustrated exemplary embodiment of FIG. 5, the LEDs 14a, 14b are connected in series on the substrate 12. The anode 44 and the cathode 46 of the series LED combination 14a, 14b are accessible at connector conductor members 1 and 5, respectively. Although only two of the five conductor members are directly connected to the components in the exemplary substrate 12, it will be appreciated that providing additional conductor members, e.g. unattached members 2, 3, and 4 advantageously facilitates adding additional components, such as additional LEDs, to the substrate 12 and enhances the modularity of the system. Additionally, at least one conductor member is reserved as a circuit ground. In the exemplary embodiment of FIGS. 3 and 5, conductor member 4 is reserved as the ground conductor. Of course, it will also be recognized that other conductor designations can be made, and additionally more or fewer than five conductor members can be included on each connector 16. However, for a given modular mounting assembly some standardization of the number and designations of the conductors is highly advantageous.

With reference now to FIGS. 6 and 7, an approach for effectuating the interconnection of pairs of connectors 16 is described. An interconnecting element 50A of a type "A" operatively connects to a pair of connectors 16 at mating ports 52 and 54 of the interconnecting element 50A. The interconnecting element 50A mechanically connects to the two substrates 12 that have the pair of connectors 16 to effectuate structural interconnection between the two substrates 12. The mechanical connection can be by a frictional fit (not shown) or by fastenings 56 which can be screws, rivets, or the like. The interconnecting element 50A also has a pre-selected electrical configuration that effectuates a desired electrical arrangement of the components of the connected substrates 12, such as a series connection arrangement, parallel connection arrangement, or the like. As can be seen in FIG. 6, the two mating ports 52, 54 each have five electrical connector members 1', 2', 3', 4', 5' that correspond to and electrically connect with the connector members 1, 2, 3, 4, 5 of the connectors 16 of the substrates 12. The pre-selected electrical configuration is determined by the electrical interconnections of the two ports 52, 54 inside the interconnecting element 50A (not shown in FIG. 6). Thus, as shown in FIG. 7, two interconnecting elements 50A of type "A" that has a particular electrical configuration are used in conjunction with a third interconnecting element 50D of type "D" that has a different electrical configuration, to generate a selected electrical arrangement of the components on the three substrates 12. Those skilled in the art will appreciate that other shaped interconnecting elements can be substituted with no loss of functionality. Also, the interconnecting element or plug does not necessarily have to be separate from the substrates. That is, integral plugs can be formed on, for example, opposing sides of the substrate and configured to closely fit with the connectors or sockets of adjacent substrates.

Because the interconnecting element 50A in one embodiment is structurally symmetric but not necessarily electrically symmetric, the interconnecting element 50A includes an orientation key 58 that indicates the electrical orientation. The interconnecting element 50A also has an identifying mark "A" 60 indicating that it is a type "A" interconnecting element 50A. Of course, other marks, a color coding scheme, or the like can also be used to identify the interconnecting element type. For example, a colored band (not shown) can be asymmetrically placed on the interconnecting element 50A, in which the color correlates with the interconnecting element type and the asymmetric placement provides an orientation key.

With reference now to FIGS. 8A through 11B, four exemplary electrical configurations for interconnecting and terminating elements are described. The exemplary electrical configurations are described with reference to the electrical configuration of the substrate shown in FIGS. 3 and 5 in which each substrate 12 has two series-connected LED components 14a, 14b thereon. Furthermore, the interconnecting and terminating elements are configured using the conductor element 4 as the circuit ground.

Figure 8B:
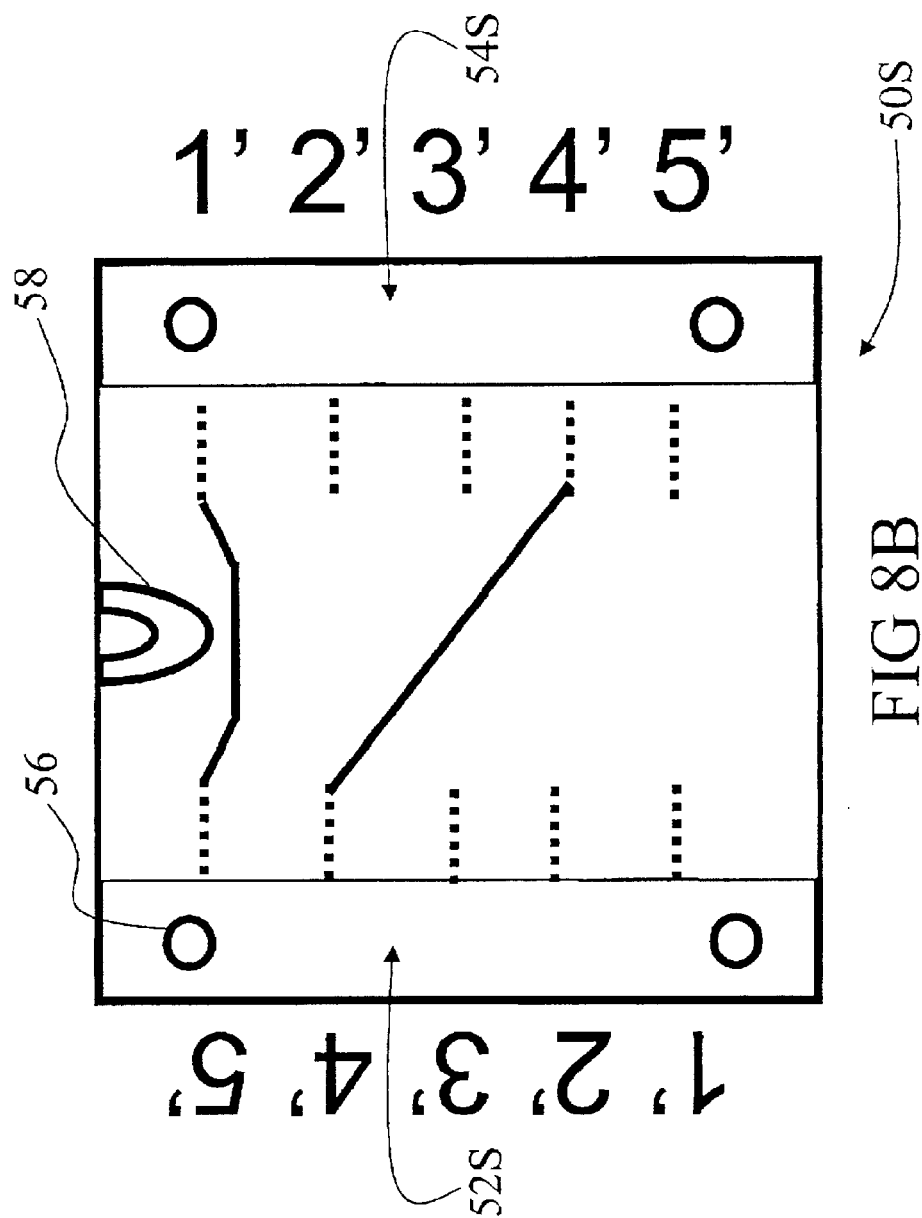
FIG. 8B shows an exemplary interconnecting element that implements the series interconnection shown in FIG. 8A

With particular reference now to FIGS. 8A and 8B, a series interconnection of two such substrates 12 is described. The pre-selected series electrical configuration is shown in FIG. 8A. An interconnecting element 50S electrically connects the conductor member 5 of a first substrate 12 with the conductor member 7 of a second substrate 12 to effectuate a series interconnect. Additionally, the ground conductor members 4 are connected to provide ground continuity across the substrates 12. As shown in FIG. 8B, this corresponds to the illustrated interconnecting element 50S in which the conductor member 5' of the first port 52S is electrically connected with the conductor member 1' of the second port 54S to effectuate the series interconnection, and the conductor member 4' of the first port 52S is electrically connected with the conductor member 4' of the second port 54S to maintain ground continuity.

Figure 9A:
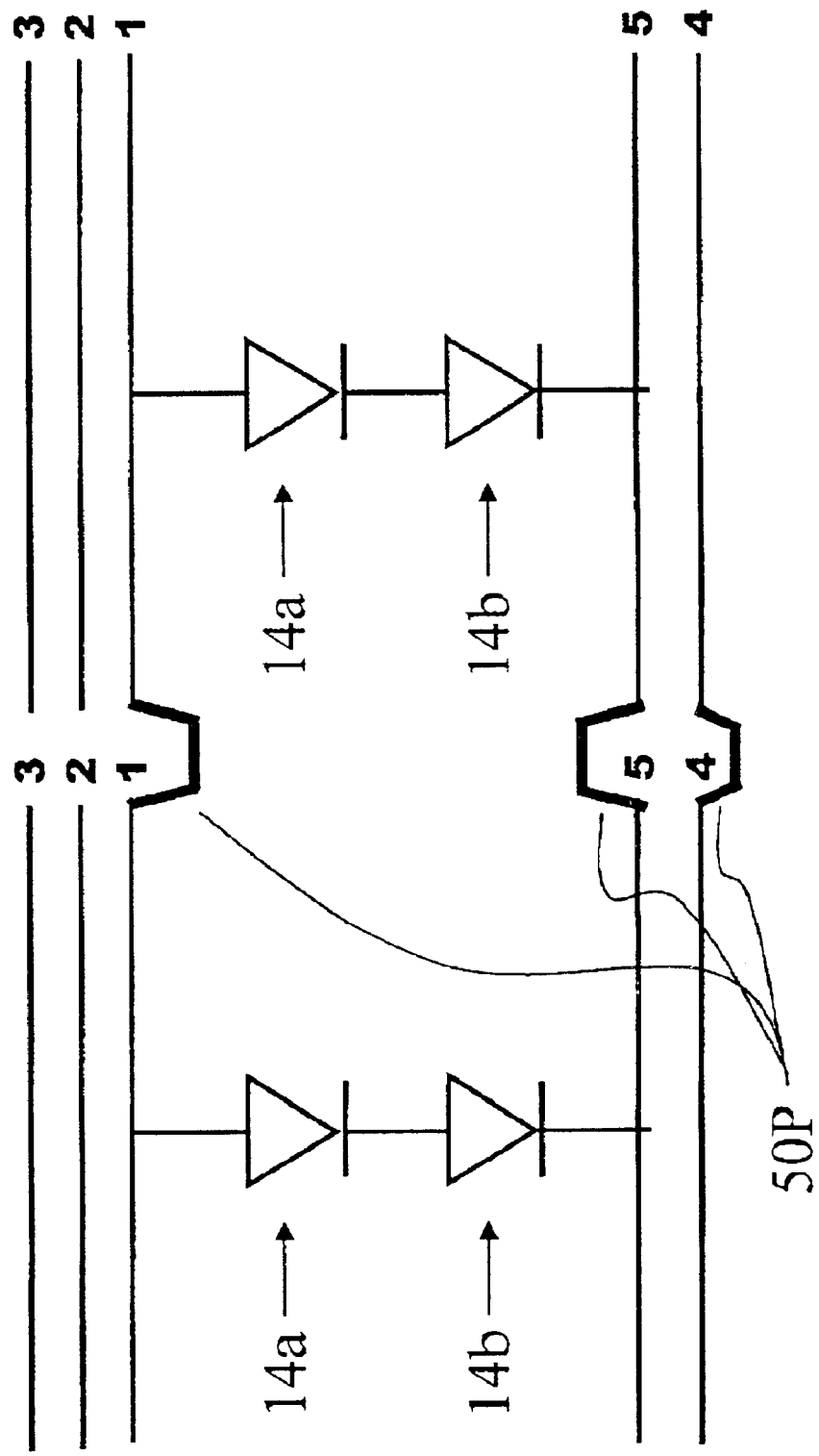
FIG. 9A shows an electrical schematic of a parallel connection of two substrates corresponding to the substrate embodiment of FIGS. 3 and 5.
Figure 9B:
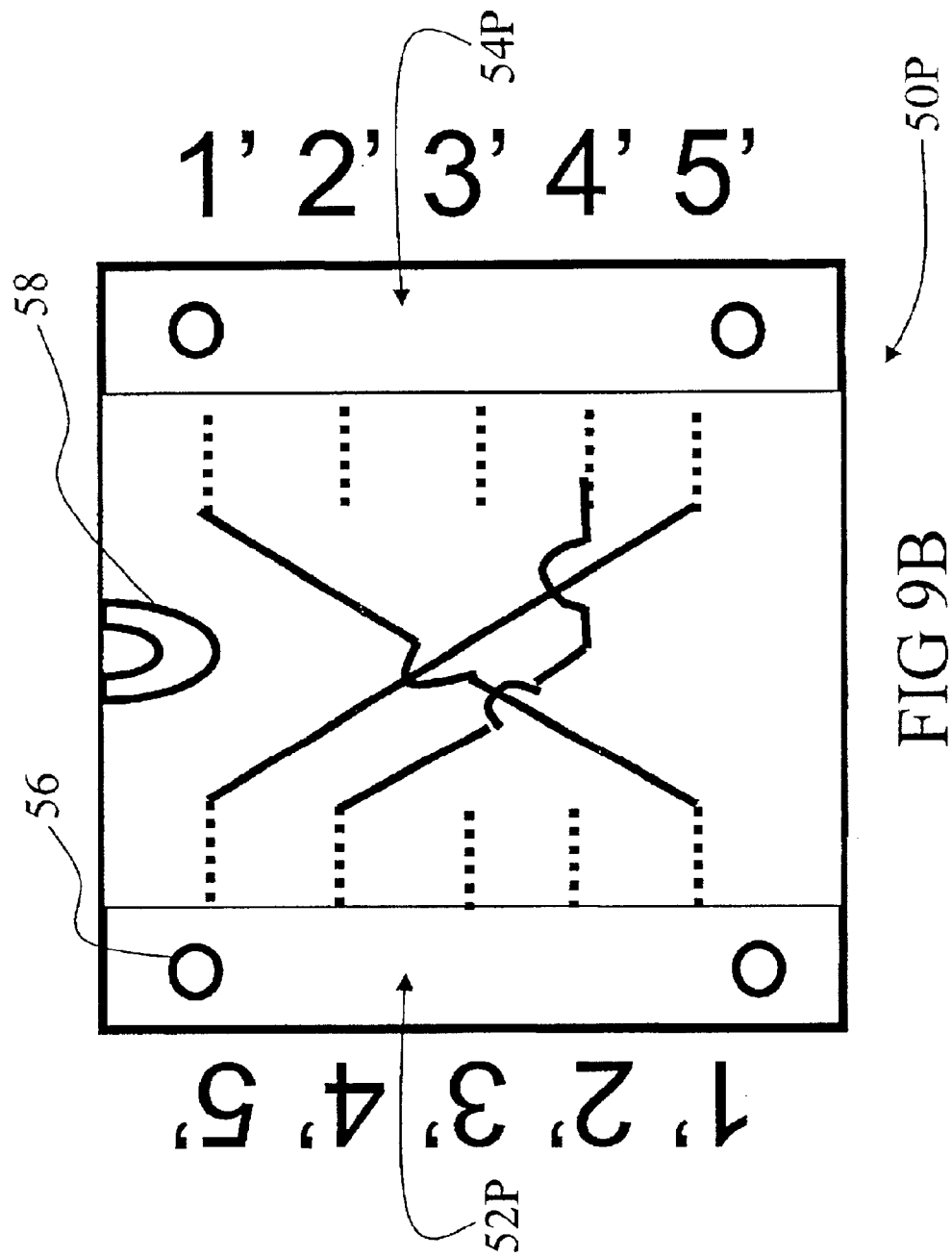
FIG. 9B shows an exemplary interconnecting element that implements the parallel interconnection shown in FIG. 8A.

With particular reference now to FIGS. 9A and 9B, a parallel interconnection of two substrates 12 is described. The pre-selected parallel electrical configuration is shown in FIG. 9A. An interconnecting element 50P electrically connects the conductor member 1 of a first substrate 12 with the conductor member 1 of a second substrate 12, and interconnects the conductor member 5 of the first substrate 12 with the conductor member 5 of the second substrate 12, to effectuate the parallel interconnect. Additionally, the conductor member 4 of the first substrate 12 is interconnected with the conductor member 4 of the second substrate 12 to effectuate ground continuity across the substrates. As shown in FIG. 9B, this corresponds to the illustrated interconnecting element 50P in which the conductor member 7' of the first port 52P is electrically connected with the conductor member 7' of the second port 54P, the conductor member 5' of the first port 52P is electrically connected with the conductor member 5' of the second port 54P, and the conductor member 4' of the first port 52P is electrically connected with the conductor member 4' of the second port 54P.

Figure 10A:
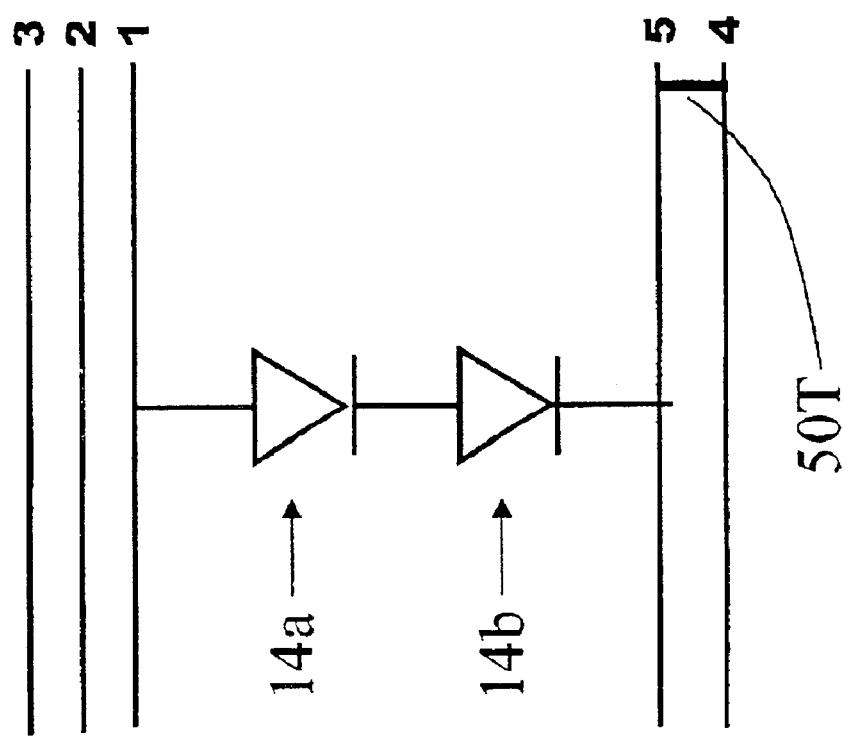
FIG. 10A shows an electrical schematic of a terminating element that connects the cathode of the last substrate according to the substrate embodiment of FIGS. 3 and 5 to circuit ground.

With particular reference now to FIGS. 10A and 10B, a terminating element 50T is shown. The terminating element 50T is appropriate, for example, for terminating one or more series- or parallel-interconnected substrates 12. An electrical schematic showing the operation of the terminating element 50T is shown in FIG. 10A. The terminating element 50T electrically connects the conductor member 5 of the last substrate 12 to the circuit ground conductor member 4. As shown in FIG. 10B, this corresponds to the illustrated terminating element 50T which has only a single port 52T that has its conductor member 5' electrically connected with the conductor member 4' to effectuate the grounding of the conductor member 5'.

Figure 11A:
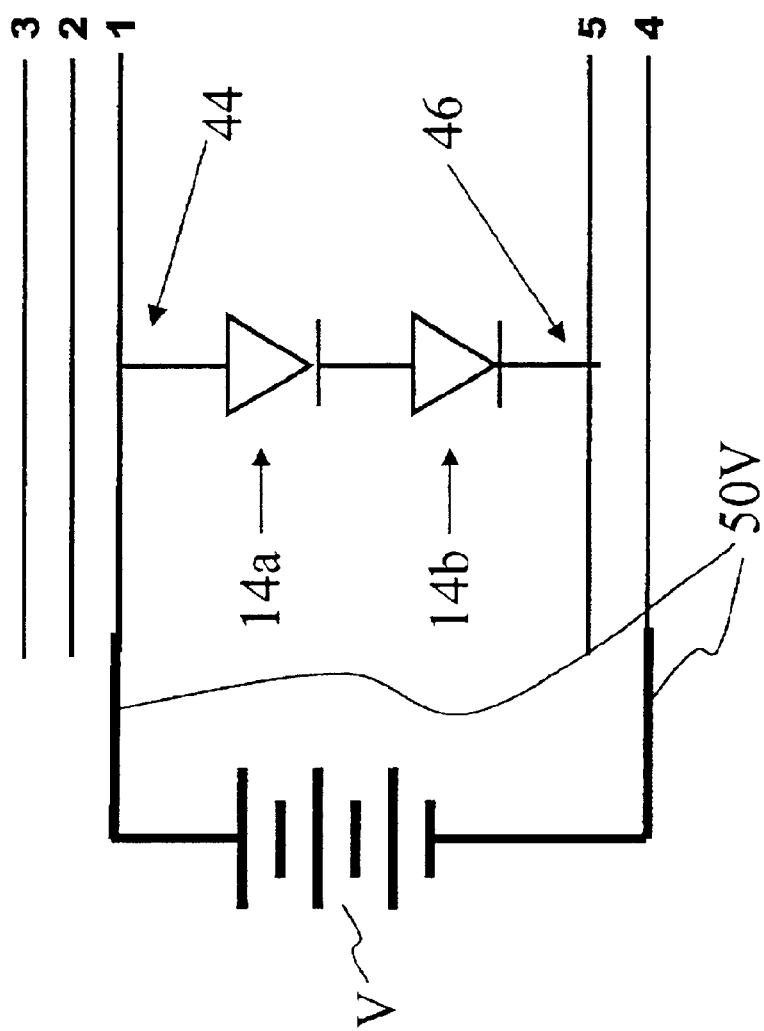
FIG. 11A shows an electrical schematic of a terminating element that connects a substrate of the type shown in FIGS. 3 and 5 to a voltage source.
Figure 11B:
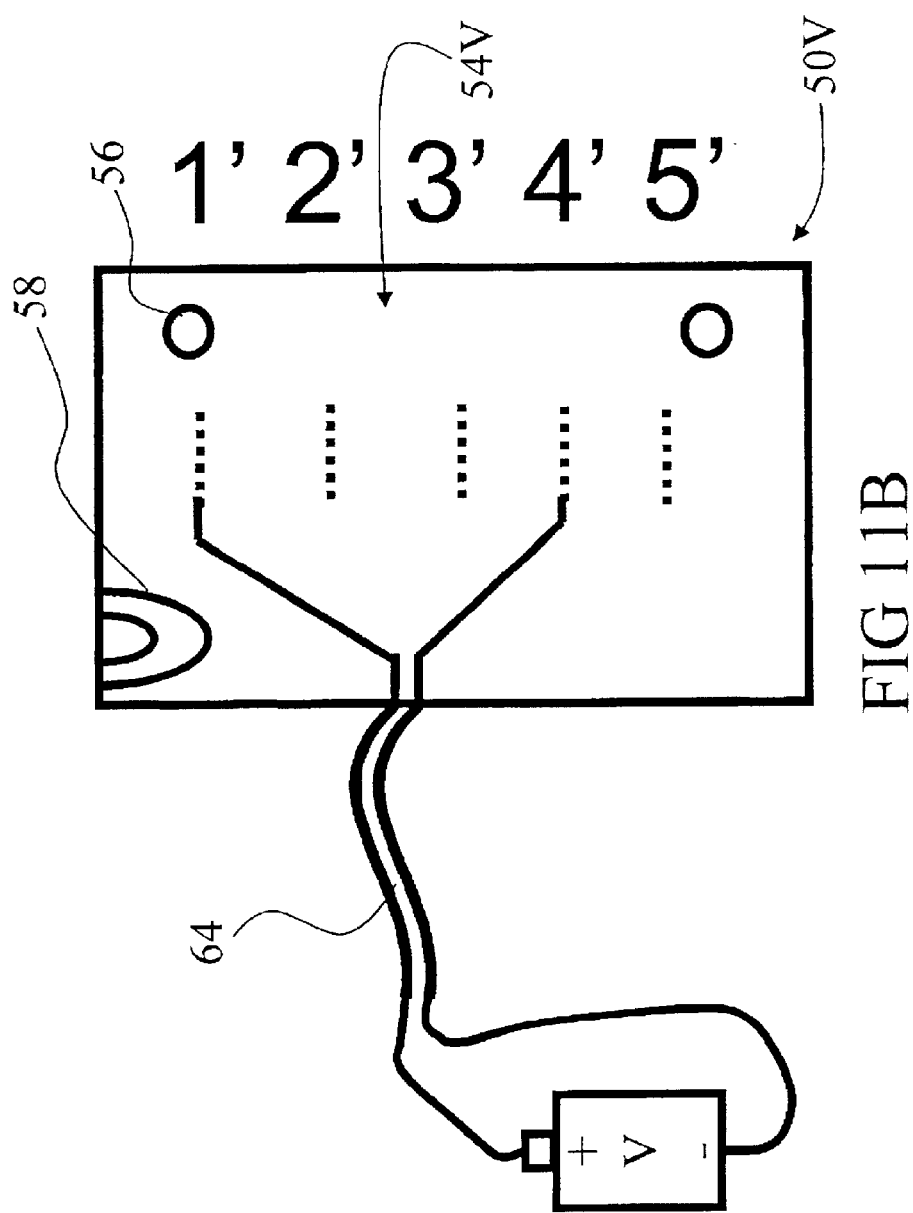
FIG. 11B shows an exemplary interconnecting element that implements the voltage connection shown in FIG. 11A.

With particular reference now to FIGS. 11A and 11B, a terminating element 50V providing electrical power to a circuit assembly is described. The terminating element 50V is appropriate, for example, for connecting one or more series- or parallel-interconnected substrates 12 to a source of electrical power. The electrical configuration is shown in FIG. 11A. The terminating element 50V electrically connects the conductor member 1 to the positive terminal of an associated voltage source V, and also connects the ground conductor member 4 to the negative terminal of the associated voltage source V. As shown in FIG. 11B, this corresponds to the illustrated terminating element 50V which has only a single port 54V. The conductor member 1' is electrically connected with the positive terminal of the associated voltage source V, while the conductor member 4' is electrically connected to the negative terminal of the associated voltage source V. In one embodiment, the terminating element 50V connects to the associated voltage source V through an electrical cable 64 that is disposed between the terminating element 50V and the voltage source V. Of course, other electrical connecting and transmission elements can also be included, such as a jack (not shown) that detachably connects the cable 64 to the terminating element 50V, and/or a jack (not shown) that detachably connects the cable 64 to the voltage supply V.

Other interconnecting and terminating elements are also contemplated. For example, a "null" interconnecting element (not shown) having no electrical interconnections therein can be provided. Such a "null" connecting element advantageously provides structural support to the modular mounting assembly without including corresponding electrical interconnections. It will also be recognized that the specific electrical configurations of the interconnecting elements depend upon both the selected electrical interconnection and on the electrical configuration of the substrate. The exemplary interconnecting and terminating elements of FIGS. 8A through 11B are appropriate for the substrate 12 illustrated in FIGS. 3 and 5. Regardless of the electrical configuration, the mechanical configuration of the interconnecting elements is advantageously standardized to facilitate formation of complex modular mounting structures such as the hexagonal structure 10 of FIG. 1.

In one aspect of the invention, standardized substrates are provided on which components, such as LED components, can be affixed. These substrates in combination with standardized interconnecting and terminating elements together cooperate to form selected modular interconnections of LED components. The interconnecting and terminating elements can advantageously include orientation key marks 58 and type indicators 60 to avoid misconnection. Although symbolic type indicators are shown in exemplary FIGS. 6 and 7, other type indicators such as color coding schemes are also contemplated. The ports 52, 54 also can be orientationally keyed (not shown) to further reduce the possibility improperly interconnecting the substrates comprising the modular mounting assembly.

With reference now to FIG. 12, an exemplary assembly of six LED components on three substrates 12 is shown. Power is supplied from the voltage source V via a terminating element 50V. The three substrates 12 are interconnected using two series interconnecting elements 50S. The series string is terminated by a terminating element 50T, which differs from the terminating element 50T of FIGS. 10A and 10B in that an electrically unconnected second port is included to provide improved structural integrity. Although the extra port of terminating element 50T' is shown as completely electrically unconnected, in another contemplated embodiment the ground terminals 4' of the two ports are interconnected to provide additional ground continuity. In yet another contemplated embodiment (not shown) the terminating element 50T' is replaced by a completely electrically unconnected interconnecting element that has no electrical interconnections and provides only structural support to the modular mounting, and a connector of type 50T is connected to one of the unpaired ports of the last substrate 12 in the electrical series to provide the electrical termination.

The illustrated modular configuration of FIG. 12 can be converted to a configuration having the three substrates 12 in parallel with the two LED components 14a, 14b of each substrate 12 connected in series by simply replacing the two series interconnecting elements 50S with corresponding parallel interconnecting elements 50P. The exemplary circuit shown in FIG. 12 is rather simple. However, it will be appreciated that highly complex modular assemblies including dozens, hundreds, or even greater numbers of LED components having complex spatial arrangements, electrical interconnections, electrical sub-circuits, and the like can be created by appropriate selection and arrangement of a standardized set of substrates, interconnecting elements, and terminating elements. Another advantage of the present invention is that replacement of a failed LED component is greatly simplified, and requires only replacement of the substrate on which the failed LED component is disposed.

Figure 13:
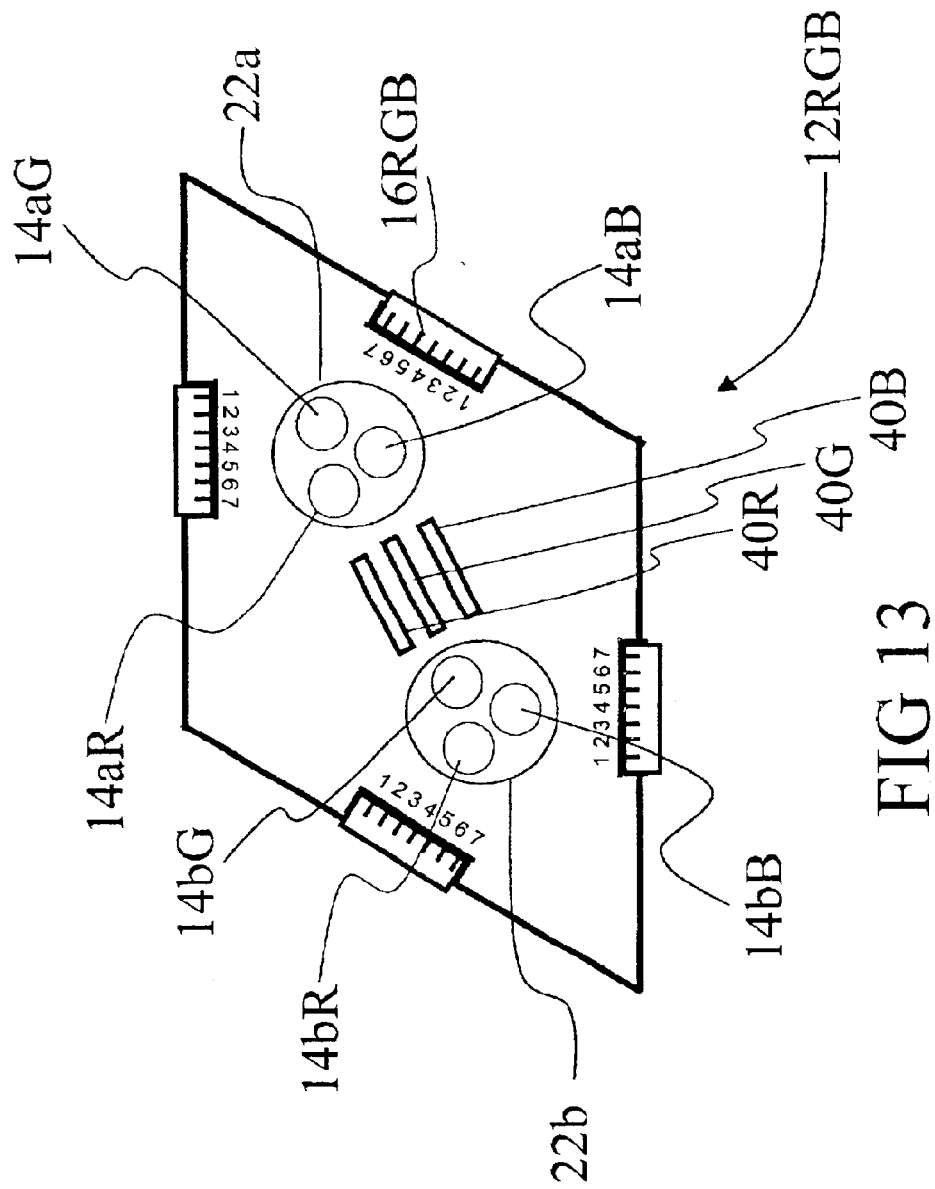
FIG. 13 shows a second embodiment of the invention, having two sets of red, green, and blue LED components that provides independent electrical access to the three colors.
Figure 14:
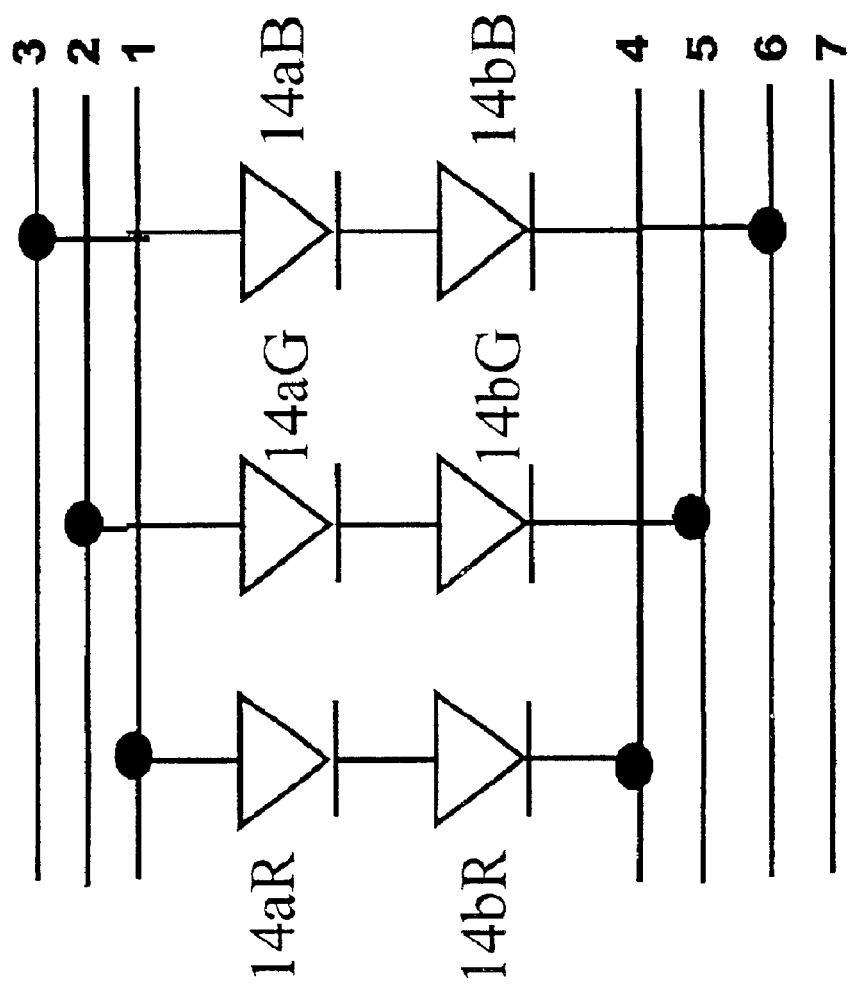
FIG. 14 shows an electrical schematic of the substrate of FIG. 13.

With reference now to FIGS. 13 and 14, another embodiment of the modular mounting assembly is described. A substrate 12RGB has six LED components arranged thereon: a first red LED component 14aR, a first green LED component 14aG, and a first blue LED component 14aB arranged in a first receiving well 22a; and a second red LED component 14bR, a second green LED component 14bG, and a second blue LED component 14bB arranged in a second receiving well 22b, as shown. The first and second LED component of each color is connected in series by PC board traces 40R, 40G, and 40G. In order to accommodate the greater number of anode and cathode terminals in this tri-color substrate 12RGB, connectors 16RGB having seven conductor members each is used. As shown in the electrical schematic of FIG. 14, each of the three colors is independently addressable: conductor members 1 and 4 connect to the red LED series; conductor members 2 and 5 connect to the green LED series; and conductor members 3 and 6 connect to the blue LED series. The conductor member 1 serves as circuit ground in the substrate 12RGB. For substrates having more complex interconnections such as those shown in FIGS. 13 and 14, two-level or even more complex PC boards can be used to accommodate the larger number of traces involved.

It will be appreciated by those of ordinary skill in the art that the substrates comprising a modular mounting assembly need not have identical components arranged thereon, as long as the connectors are electrically and structurally compatible. Thus, for example, substrates having low intensity LED components (not shown) and substrates having high intensity LED components (not shown) can be intermixed in an array to form a dual-intensity lamp. Because the electrical characteristics of LED components of different intensities often differ, and because it can be desirable to independently address the low intensity LED and the high intensity LED sub-arrays, different electrical conductor members can be advantageously used for the different LED intensities. Thus, for example, in a five-conductor connector, conductors 1 and 2 can be used for the low intensity LED interconnects, conductors 3 and 4 can be used for the high intensity LED interconnects, and conductor 5 can be used as the system ground. The substrates having only high intensity LED components advantageously have the conductor members 1 of the various connectors interconnected on the substrate, and similarly the conductor members 2 of the various connectors are advantageously interconnected, whereby electrical continuity for the low intensity sub-circuit is provided across the modular assembly. Similarly, the high intensity conductor members 3 and 4 of the connectors are advantageously interconnected, respectively, on the substrates having only low intensity LED components.

In another contemplated variation, blank substrates, e.g. substrates having no components thereon, can advantageously be used as spaceholders in the modular assembly. Once again, like electrical conductor members of the blank substrate connectors can be interconnected on the substrate to provide electrical continuity where necessary.

Figure 15:
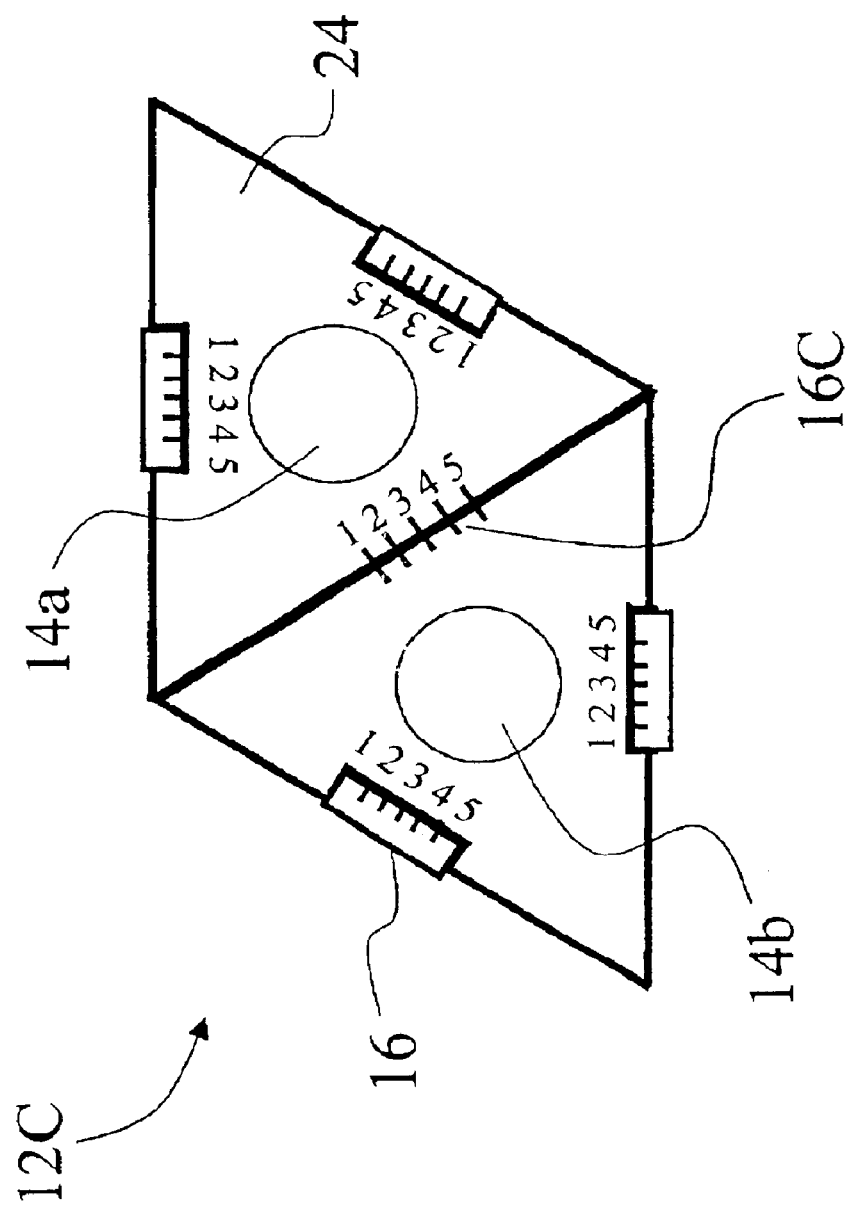
FIG. 15 shows a third embodiment of the invention that includes a connector appropriate for connection to a connecting cable.

With reference now to FIGS. 15 and 16, yet another embodiment of the invention is described, that is particularly suitable for interconnecting LED components on a flexible cable or other linear element. Such "LED strings" can be used as flexible linear light sources. As shown in FIG. 15, the embodiment includes a substrate 12C that is essentially similar to the substrate 12 shown in FIGS. 3 and 5, except that an additional vertically oriented connector 16C is included on the substrate 12C. As shown in FIG. 16, the connector 16C advantageously connects to a power cable 10 to form the LED string. In order to maximize the modularity of the substrate 12C, the substrate optionally retains the edge connectors 16, so that the substrate 12C can be used either in a planar array assembly such as the hexagonal assembly 10 of FIG. 1, or in a linear LED string assembly as shown in FIG. 16. Of course, the connectors 16 can also be omitted from the substrate 12C to reduce manufacturing costs.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A mounting structure for assembling a plurality of optoelectronic components, comprising:

a first substrate on which at least one first optoelectronic component is arranged, the first substrate being in the shape of a rhombus and having an edge connector disposed on an edge thereof providing electrical access to the at least one first optoelectronic component; and a second substrate on which at least one second optoelectronic component is arranged, the second substrate being in the shape of a rhombus and having an edge connector disposed on an edge thereof providing electrical access to the at least one second optoelectronic component, the edge connector of the second substrate connecting with the edge connector of the first substrate to the at least one first optoelectronic component and the at least one second optoelectronic component.

2. The mounting structure as set forth in claim 1, wherein: each of the first substrate and the second substrate has a rhombus shape that corresponds to a primitive unit cell of a hexagon.

3. The mounting structure as set forth in claim 1, further comprising:

an interconnecting element interposed between the edge connectors of the first and second substrates that connects with the edge connector of the first substrate and that connects with the edge connector of the second substrate to connect the edge connector of the first substrate with the edge connector of the second element.

4. The mounting structure as set forth in claim 1, wherein the first substrate includes:

a thermally conductive layer; and a printed circuit board into which the edge connector is formed, the printed circuit board including an electrical path connecting the at least one first optoelectronic component with the edge connector.

5. The mounting structure as set forth in claim 4, wherein:
the at least one first optoelectronic component includes at least one light emitting diode (LED); and
the first substrate includes a lens in operative communication with the at least one LED.

6. The mounting structure as set forth in claim 4, wherein:
the at least one first optoelectronic component includes a plurality of light emitting diodes (LEDs) disposed on the substrate; and
the printed circuit board includes an electrical path that electrically interconnects the LEDs disposed on the substrate.

7. The mounting structure as set forth in claim 6, wherein:
the thermally conductive layer has depressions in which the LEDs are arranged; and
the printed circuit board has holes arranged to allow the LED light emission to pass through.

8. The mounting structure as set forth in claim 1, further comprising:
a third substrate on which at least one third optoelectronic component is arranged, the third substrate being in the shape of a rhombus and having first and second edge connectors disposed on edges thereof providing electrical access to the first and second optoelectronic components, the first edge connector electrically interconnecting with a second edge connector of the first substrate, the second edge connector of the third substrate electrically interconnecting with a second edge connector of the second substrate, the first, second, and third rhombus-shaped substrates being arranged to form a hexagonally shaped mounting structure.

9. The mounting structure as set forth in claim 1, further comprising:
a terminating element connecting with a second edge connector of one of the first and second substrates, the terminating element including circuitry that completes an electrical circuit including the at least one first and second optoelectronic components.

10. The mounting structure as set forth in claim 1, further comprising:
a terminating element connecting with a second edge connector of one of the first and second substrates to supply electrical power to the mounting structure including the at least one first and second optoelectronic components.

11. The mounting structure as set forth in claim 1, wherein the first and second substrates are generally planar and lie in a common plane when electrically interconnected by the edge connectors.

12. A modular mounting assembly for connecting a plurality of light emitting diodes (LEDs), the mounting assembly comprising:
a plurality of substrates, each substrate having:
at least one LED fixedly arranged thereon, and
a plurality of connectors arranged thereon that are in electrical
communication with the at least one LED fixedly arranged thereon,
wherein the plurality of substrates are arranged in a spatial arrangement having selected connectors of adjacent substrates connected together to electrically interconnect the plurality of LEDs in a preselected electrical pattern.

13. The modular mounting assembly as set forth in claim 12, further comprising:
a plurality of interconnecting elements interposed between selected adjacent substrates that electrically and structurally interconnect the selected adjacent substrates.

14. The modular mounting assembly as set forth in claim 12, wherein:
the plurality of substrates each have a non-rectangular rhombic shape.

15. The modular mounting assembly as set forth in claim 12, wherein the spatial arrangement of the plurality of substrates defines a two-dimensional array.

16. A light emitting structure comprising:
a plurality of multi-sided substrates arranged with at least one side of each substrate adjacent a side of a neighboring substrate, electrical connectors of the adjacent sides electrically connecting the neighboring substrates together via an associated interconnecting element; and
a plurality of light emitting elements disposed on the plurality of multi-sided substrates, the light emitting elements being electrically interconnected via the electrical connectors, wherein the light emitting structure is selectively configurable into any of a plurality of physical and electrical configurations by selectively arranging the multi-sided substrates and by selecting interconnecting elements with pre-selected electrical configurations that effectuate the selected electrical configuration of the light emitting structure.

17. The light emitting structure as set forth in claim 16, wherein each connector includes a plurality of electrical conductor members, and the light emitting structure further comprises:
a plurality of interconnecting elements, each interconnecting element being disposed between two neighboring multi-sided substrates and electrically connecting with the connectors of the two adjacent sides, each interconnecting element electrically connecting the electrical conductor members of the connectors of the two adjacent sides together in a pre-selected electrical configuration.

18. The light emitting structure as set forth in claim 16, wherein each connector includes a plurality of electrical conductor members, and the light emitting structure further comprises:
a plurality of interconnecting elements interposed between the neighboring multi-sided substrates, each interposed interconnecting element mechanically fastening the neighboring substrates together and having two ports that electrically connect with the two connectors of the two adjacent sides, each interconnecting element electrically connecting the electrical conductor members of the connectors of the two adjacent sides together in a pre-selected electrical configuration.

* * * * *